(12) United States Patent
Nishimura

(10) Patent No.: US 7,619,330 B2
(45) Date of Patent: Nov. 17, 2009

(54) STAGE APPARATUS

(75) Inventor: Mitsuo Nishimura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 308 days.

(21) Appl. No.: 11/688,228

(22) Filed: Mar. 19, 2007

(65) Prior Publication Data

US 2007/0222303 A1    Sep. 27, 2007

(30) Foreign Application Priority Data

Mar. 22, 2006  (JP) .............................. 2006-079056

(51) Int. Cl.
*H02K 41/00* (2006.01)
(52) U.S. Cl. .......................................... 310/12; 355/53
(58) Field of Classification Search ............ 310/12–14, 310/90.5; 355/53, 72
See application file for complete search history.

(56) References Cited

U.S. PATENT DOCUMENTS 6,903,468 B2    6/2005 Korenaga

FOREIGN PATENT DOCUMENTS

JP    2004-079639 A    3/2004

*Primary Examiner*—Javaid Nasri
(74) *Attorney, Agent, or Firm*—Canon USA Inc IP Div

(57) ABSTRACT

A stage apparatus includes a movable stage; a magnetic unit including a first permanent magnet that is provided on the stage and magnetized in a direction perpendicular to a moving direction of the stage and at least one pair of second permanent magnets that are magnetized such that opposing portions of the first and second permanent magnets have the same pole. The magnetic unit applies a force to the stage in the moving direction thereof by placing the first permanent magnet between the pair of second permanent magnets. An actuator is configured to drive the second permanent magnets in the direction of magnetization. The force applied to the stage is varied by driving the actuator.

12 Claims, 12 Drawing Sheets

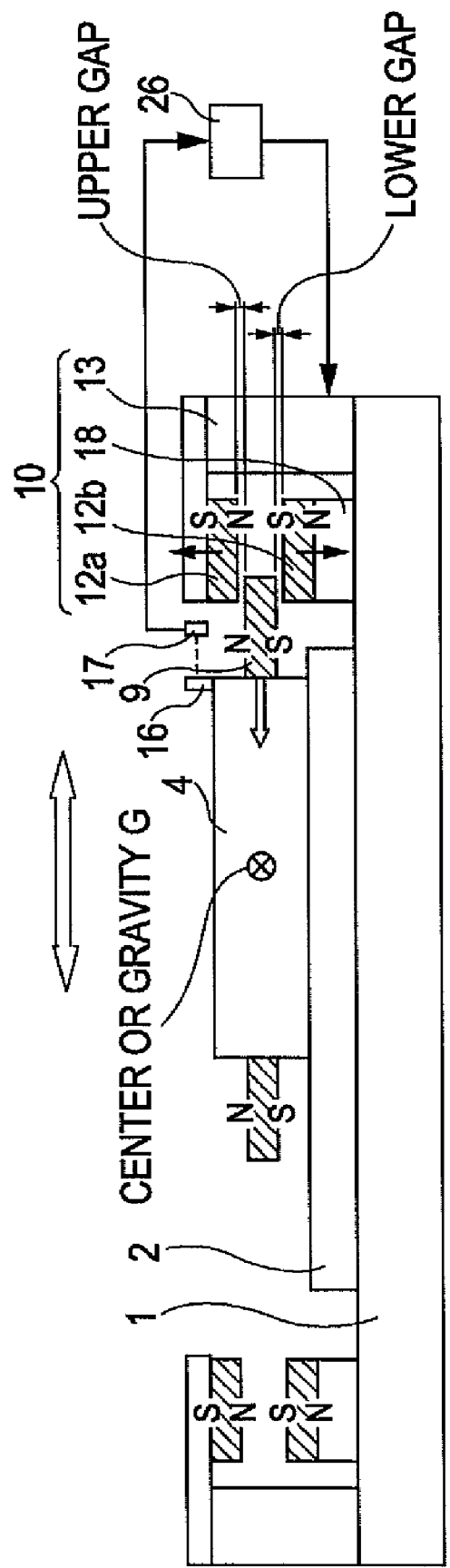

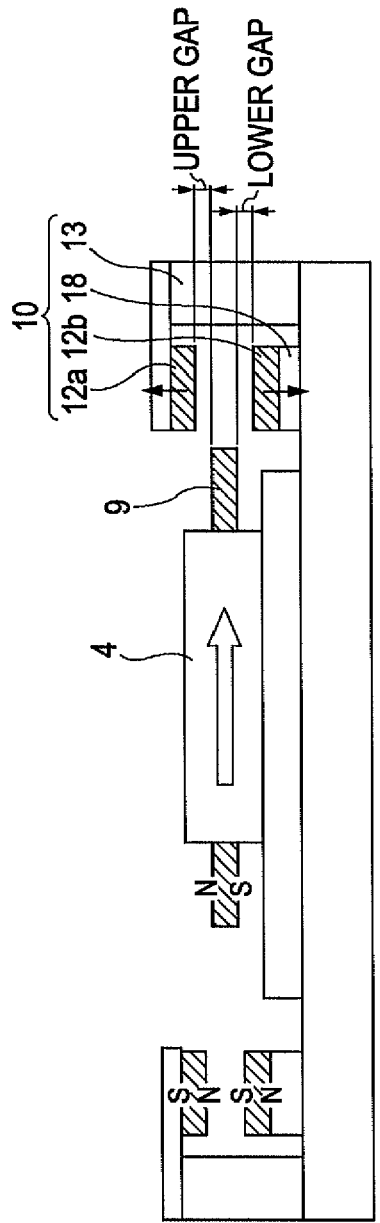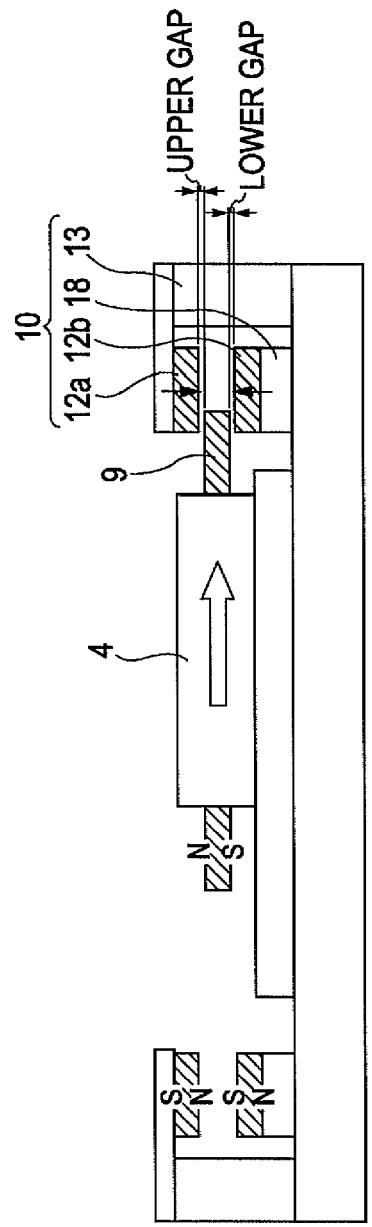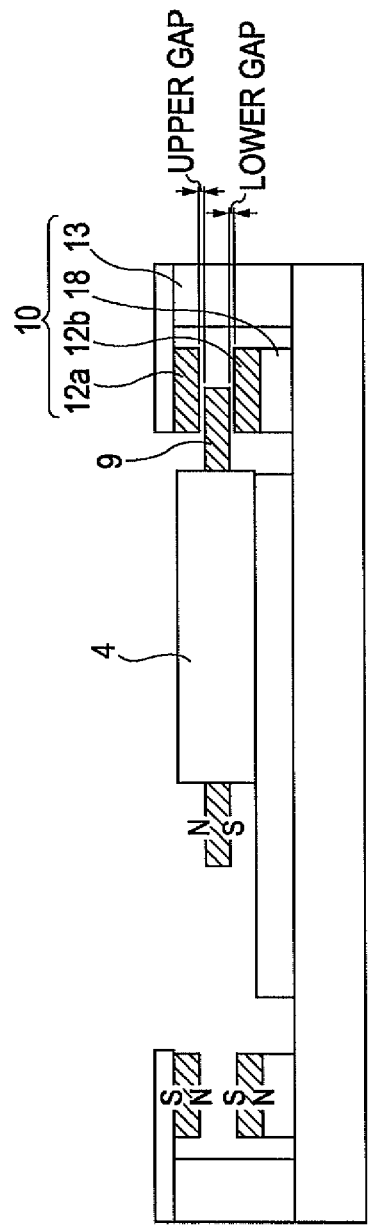
FIG. 6A
FIG. 6B
FIG. 6C

STAGE APPARATUS

BACKGROUND OF THE INVENTION

1. Field of the Invention

The present invention relates to a stage apparatus for positioning an object, and more particularly to a reticle stage for an exposure apparatus.

2. Description of the Related Art

In a typical exposure apparatus, a stage apparatus is used for positioning a substrate or an original (hereinafter generically called a substrate). Japanese Patent Laid-Open No. 2004-079639 (corresponding to U.S. Pat. No. 6,903,468) discloses a stage apparatus that uses a repulsive force generated by permanent magnets for accelerating and decelerating a stage on which the substrate is placed.

The stage apparatus described in Japanese Patent Laid-Open No. 2004-079639 will be described below with reference to FIGS. 11A and 11B. A stage 104 on which a workpiece 103 is placed is guided by a guide 102 in the Y direction. The stage 104 is attached to movable members 105 of linear motors having fixed members 106 that are attached to a base (not shown). A force is generated between each movable member 105 and the corresponding fixed member 106, thereby driving the stage 104 in the Y direction.

Permanent magnets 109 are provided on the front and back sides of the stage 104 in a moving direction thereof. In addition, a pair of permanent magnets 112 that are vertically spaced from each other by a predetermined distance is fixed on the guide 102 at each side of the stage 104 in the moving direction thereof. The permanent magnets 109 and 112 are magnetized in the Z direction such that opposing surfaces thereof have the same pole. When the stage 104 is at either of its stroke ends and one of the permanent magnets 109 is placed between the corresponding pair of permanent magnets 112, a repulsive force that accelerates or decelerates the stage 104 is generated between the permanent magnets 109 and 112.

The above-described stage apparatus uses repulsive forces generated by the permanent magnets for accelerating and decelerating the stage. In such a stage apparatus, to set the stage in a standby state at a position where the repulsive force is applied thereto, a large force must be continuously generated by the linear motors during the standby period. When, for example, the stage apparatus is used as a reticle stage in an exposure apparatus, the stage is generally stopped at a position near a stroke end in a process of replacing a reticle. However, when a force sufficient to cancel the repulsive force is generated by the linear motors, heat is generated by the linear motors, which causes undesirable effects. In addition, the large force that is externally applied to the stage in the process of replacing the reticle can cause deformation of the stage or the reticle. These problems also occur when the stage position is initialized.

SUMMARY OF THE INVENTION

The present invention is directed to a stage apparatus that can overcome the disadvantages caused by repulsive force applied to a stage by permanent magnets.

A stage apparatus according to an aspect of the present invention includes a movable stage; a magnetic unit including a first permanent magnet that is provided on the stage and magnetized in a direction perpendicular to a moving direction of the stage and at least one pair of second permanent magnets that are magnetized such that opposing portions of the first and second permanent magnets have the same pole, the magnetic unit applying a force to the stage in the moving direction thereof by placing the first permanent magnet between the pair of second permanent magnets; and an actuator configured to drive at least one of the second permanent magnets in the direction of magnetization. The force applied to the stage is varied by driving the actuator.

In the embodiments described below, a stage apparatus in which the second permanent magnets are moved toward and away from each other in the direction of magnetization is explained.

Further features of the present invention will become apparent from the following description of exemplary embodiments with reference to the attached drawings.

BRIEF DESCRIPTION OF THE DRAWINGS

FIG. 2 is a schematic side view of a stage apparatus according to a second embodiment.

FIGS. 6A to 6E illustrate the manner in which a stage is moved in a fourth embodiment.

DESCRIPTION OF THE EMBODIMENTS

First Embodiment

Figure 1A:
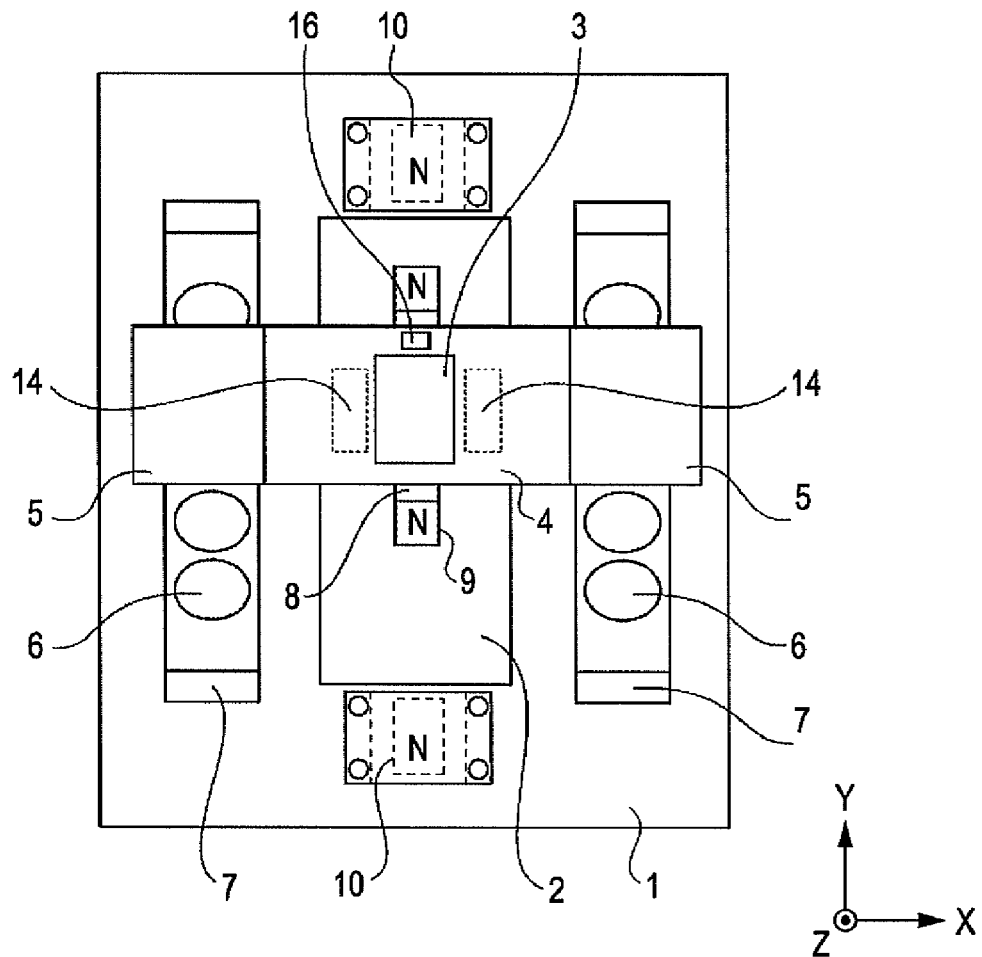
FIGS. 1A and 1B are schematic diagrams illustrating a stage apparatus according to a first embodiment.

FIG. 1A is a plan view of a stage apparatus according to a first embodiment of the present invention. The stage apparatus includes a stage 4 that moves while a substrate 3 is placed thereon, a guide 2 that guides the stage 4 with gas bearings 14 interposed therebetween, and linear motors for driving the stage 4 in the Y direction. In the following description, a "moving direction" refers to the Y direction. The guide 2 is fixed to a base 1 and defines an XY plane that functions as a guide plane. The gas bearings 14 can be replaced by other types of bearings depending on the required positioning accuracy of the stage 4. The substrate 3 is retained by a chuck (not shown) fixed to the stage 4. The chuck includes, for example, a clamp, a vacuum suction mechanism, an electrostatic suction mechanism, etc.

The stage 4 can also be provided with a fine-motion stage on which the substrate 3 is placed. In such a case, the substrate 3 can be accurately positioned by precisely moving the fine-motion stage with respect to the stage 4.

Each of the linear motors include a movable member 5 and a fixed member 6. The movable members 5 of the linear motors include permanent magnets fixed on both sides of the stage 4, and each of the fixed members 6 includes a plurality of coils that are arranged along the moving direction and fixed to the base 1 by a support 7. The permanent magnets included in the movable members 5 are arranged so as to face the corresponding coils without coming into contact therewith.

The magnetic fluxes of the permanent magnets generate currents in the coils as the permanent magnets pass by the coils. Accordingly, the stage 4 is driven in the Y direction without contact. The structure of such a linear motor is described in Japanese Patent Laid-Open No. 2004-79639, and detailed explanations thereof are thus omitted here. The linear motors can also be replaced by other kinds of drivers.

The position of the stage 4 is detected by an interferometer 17 (see FIG. 2). Detection light emitted from a light source disposed outside the stage 4 passes through the interferometer 17 and is reflected by a reflective mirror 16 that is provided on the stage 4. The reflected light is caused to interfere with reference light, whereby the stage position is detected. The interferometer can also be replaced by other kinds of position detectors.

Figure 1B:
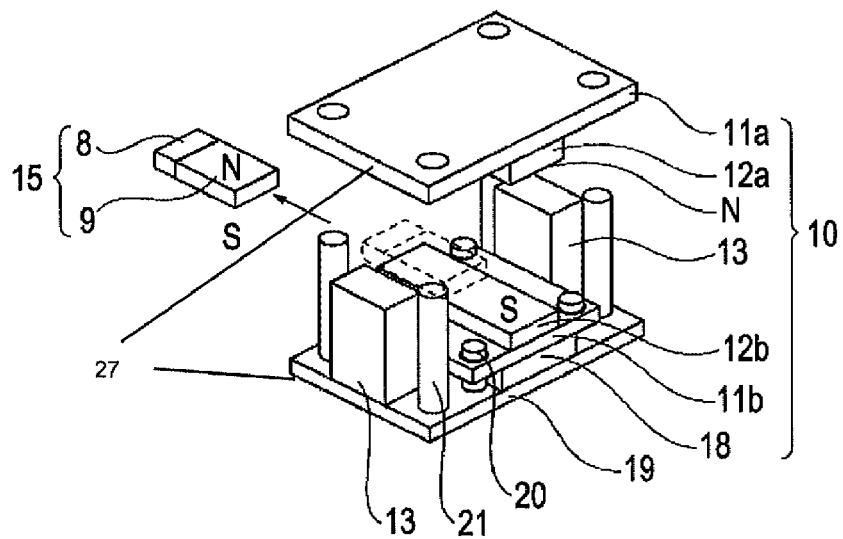

The structure of repulsive magnetic units for accelerating and decelerating the stage 4 will be described below with reference to FIG. 1B. Each of the repulsive magnetic units includes a movable magnetic unit 15 and a fixed magnetic unit 10. The movable magnetic unit 15 includes a permanent magnet 9 and a support 8 for attaching the permanent magnet 9 to the stage 4. The fixed magnetic unit 10 includes a pair of permanent magnets 12a and 12b and actuators 13 and 18 that function as drivers for respectively driving the permanent magnets 12a and 12b in the vertical direction. In the present embodiment, one pair of permanent magnets 12a and 12b that are vertically spaced from each other is provided in each fixed magnetic unit 10. However, two or more permanent magnets 12a and 12b may also be provided. In addition, it is only necessary to drive one of the upper and lower permanent magnets 12a and 12b. Two movable magnetic units 15 are provided such that one movable magnetic unit 15 is fixed on each side of the stage 4 in the moving direction thereof. In addition, two fixed magnetic units 10 are disposed to be spaced from the stage 4 at positions in front of and behind the stage 4 in the moving direction thereof. More specifically, the fixed magnetic unit 10 is disposed at each of the stroke ends of the stage 4. When the stage 4 approaches either of its stroke ends, one of the permanent magnets 9 is placed between the corresponding pair of permanent magnets 12a and 12b without coming into contact therewith.

In each of the repulsive magnetic units, the permanent magnet 9 is plate-shaped and is vertically magnetized. In the present embodiment, the permanent magnet 9 has an N-pole at the top surface thereof and an S-pole at the bottom surface thereof. The permanent magnets 12a and 12b are also plate-shaped and are vertically magnetized. The permanent magnets 12a and 12b are magnetized such that opposing surfaces of the permanent magnets 9, 12a, and 12b have the same pole. More specifically, the upper permanent magnet 12a has an N-pole at the bottom surface thereof and the lower permanent magnet 12b has an S-pole at the upper surface thereof.

According to the above-described structure, in each repulsive magnetic unit, a magnetic repulsive force is generated between the permanent magnets 9 and 12a and between the permanent magnets 9 and 12b, so that an accelerating force or a decelerating force is applied to the stage 4 in the Y direction. Since the direction in which the accelerating or decelerating force is applied and the magnetization direction are perpendicular to each other, the repulsive force can be generated over a relatively large range even when the stage 4 is moved. In addition, since the permanent magnet 9 is placed between the permanent magnets 12a and 12b, the repulsive force is canceled in the Z direction.

The structure of each fixed magnetic unit 10 will be described in detail below. In the present embodiment, the permanent magnets 12a and 12b are directly fixed to yokes 11a and 11b, respectively, and are driven by driving the yokes 11a and 11b. More specifically, the yoke 11a is attached to a base plate 19 by the actuators 13 and is guided by linear guides 21 in the Z direction. Similarly, the yoke 11b is attached to the base plate 19 by the actuators 18 and is guided by linear guides 20 in the Z direction. Each of the yokes 11a and 11b has four holes and sliders, and the linear guides 21 and 20 include guiding shafts. The guiding shafts of the linear guides 21 and 20 are inserted through the holes of the yokes 11a and 11b, respectively, so as to guide the yokes 11a and 11b.

The actuators 13 and 18 can include multilayer piezoelectric devices driven in the Z direction. Alternatively, the actuators 13 and 18 can convert rotation of pulse motors or the like into linear movement in the Z direction. Clamps 27 (fixing unit) or the like can be used for retaining the yokes 11a and 11b driven by the actuators 13 and 18, respectively. The actuators 13 and 18 are controlled by a controller 26 (see FIG. 2) in accordance with the position of the stage.

Accordingly, the gaps between the permanent magnets 9 and 12a and between the permanent magnets 9 and 12b can be varied. In other words, the repulsive force generated by the permanent magnets 9, 12a, and 12b can be adjusted. Sensors can be additionally provided for measuring the gaps between the permanent magnets 9, 12a, and 12b.

Accordingly, in the structure of the present embodiment, when it is not desirable to generate a large repulsive force, the repulsive force can be reduced by changing the gaps between the permanent magnets 9, 12a, and 12b. For example, when the stage 4 is in a standby state at a position near one of its stroke ends, the repulsive force can be reduced by the above-described method so that it is not necessary to continuously generate a large force by the linear motors. The repulsive force can also be reduced without using the structure of the present embodiment by, for example, moving the fixed magnetic units 10 in the Y direction to positions sufficiently distant from the corresponding movable magnetic units 15. However, in such a case, a large installation space is required. In comparison, according to the present embodiment, the repulsive force that causes undesirable effects can be reduced without increasing the installation space.

In addition, if the above-described gap adjustment mechanism is not provided, considerable time and labor are required to readjust the gaps between the permanent magnets after the initial adjustment performed when the stage apparatus is installed. However, according to the present embodiment, the readjustment can be done within a short time.

Second Embodiment

FIG. 2 is a schematic side view of a stage apparatus according to a second embodiment of the present invention. For simplicity, linear motors are omitted in FIG. 2. In the second embodiment, gaps between permanent magnets are adjusted such that the line of action of repulsive force generated by each repulsive magnetic unit passes through the center of gravity G of a movable table including the stage 4. In the second embodiment, descriptions regarding structures similar those of the first embodiment will be omitted.

In each repulsive magnetic unit, if the permanent magnets 12a and 12b have the same magnetic properties, the gap between the permanent magnet 9 and the permanent magnet 12a is set equal to the gap between the permanent magnet 9 and the permanent magnet 12b. When the repulsive force is changed, the permanent magnets 12a and 12b are driven while the gaps are maintained equal to each other.

Figure 3A:
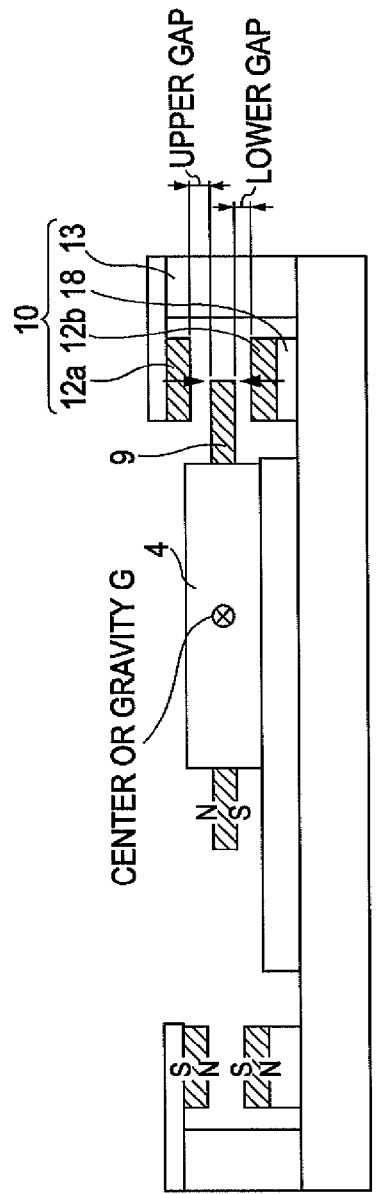
FIGS. 3A to 3C illustrate the manner in which a stage is moved in the second embodiment.
Figure 3B:
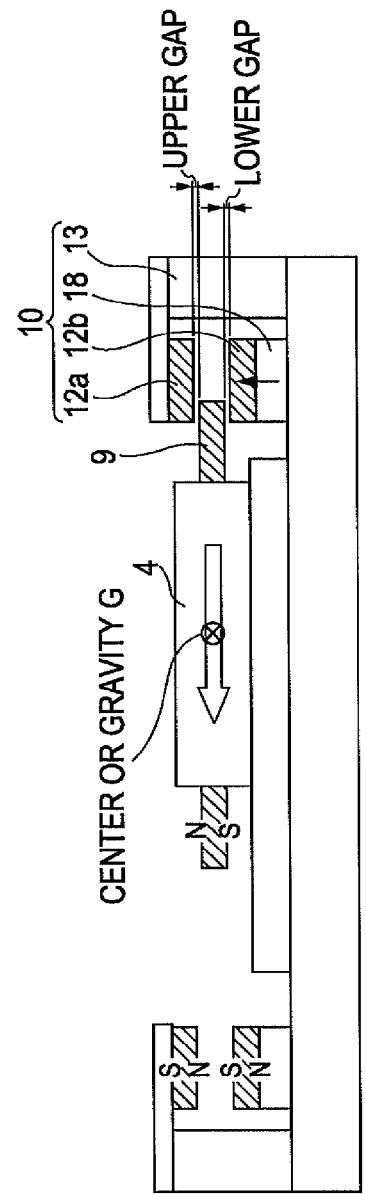
Figure 3C:
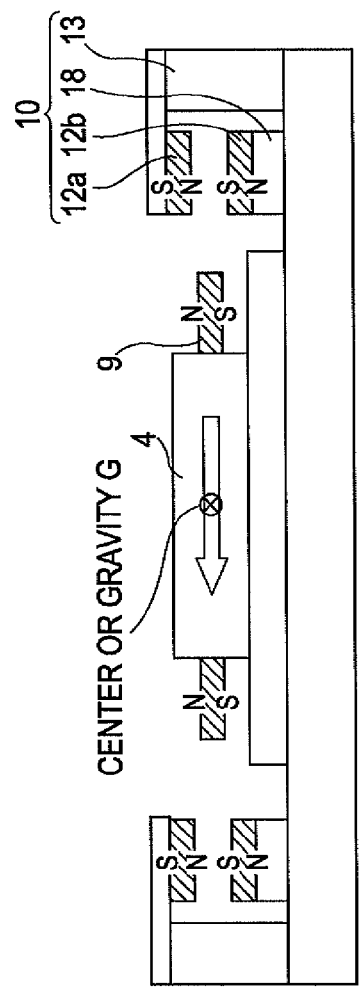
Figure 4A:
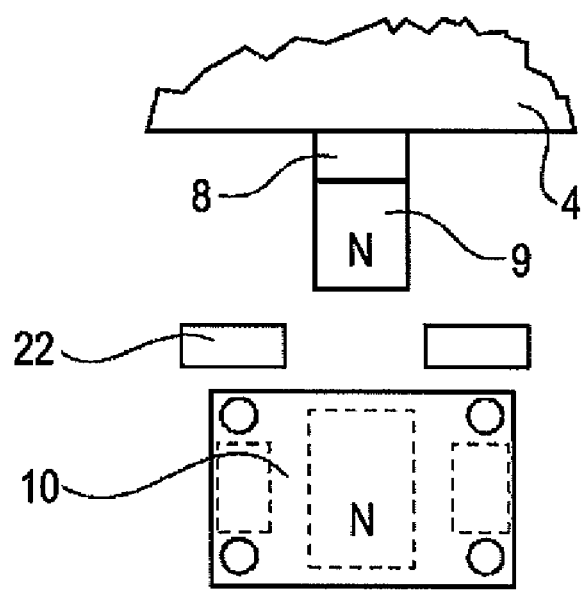
FIGS. 4A and 4B illustrate a characteristic portion of a stage apparatus according to a third embodiment.
Figure 4B:
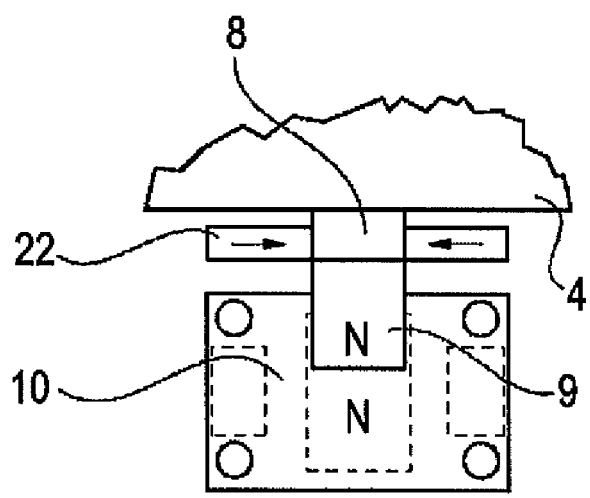

FIGS. 3A to 3C illustrate the states of the stage 4 when the repulsive magnetic units are operated. In FIG. 3A, the gaps between the permanent magnets 9 and 12a and between the permanent magnets 9 and 12b are large. To accelerate the stage 4, the permanent magnets 12a and 12b are driven to positions shown in FIG. 3B while the upper and lower gaps are maintained equal to each other. Thus, the stage 4 can be accelerated without generating a large moment around the center of gravity. Accordingly, as shown in FIG. 3C, the stage 4 moves toward the fixed magnetic unit at the opposite side.

If the permanent magnets 12a and 12b have different magnetic properties, data regarding the magnetic properties of each of the permanent magnets 12a and 12b is prepared in advance. Then, the permanent magnets 12a and 12b are driven on the basis of the prepared data.

If the line of action of the repulsive force passes through the center of gravity G of the movable table, the moment around the center of gravity G generated when the repulsive force is applied to the stage can be reduced. If such a moment is generated, the stage is tilted and the accuracy of the amount of lift of the gas bearings is reduced. As a result, a disturbance is applied to a drive control system of the stage 4. In comparison, according to the present embodiment, the influence of the disturbance on the stage 4 can be reduced and the stage 4 can be positioned with high accuracy.

Third Embodiment

FIGS. 4A, 4B, and 5A to 5C are diagrams illustrating a characteristic portion of the stage apparatus according to a third embodiment of the present invention. In the third embodiment, descriptions regarding structures similar those of the first embodiment will be omitted.

In the third embodiment, a holding mechanism 22 for retaining the stage 4 is provided between the stage 4 and each of the fixed magnetic units 10. The holding mechanism 22 retains the stage 4 by pressing the movable magnetic unit 15 using an actuator, such as an air cylinder, from both sides thereof. When the stage 4 is moved from the position shown in FIG. 4A to the position shown in FIG. 4B, where a repulsive force generated by the repulsive magnetic unit is applied to the stage 4, the holding mechanism 22 retains the stage 4. The holding mechanism 22 applies a force necessary for keeping the stage 4 in a stationary state. The retaining force of the holding mechanism 22 is turned on/off or controlled by the controller 26 in accordance with the position of the stage 4.

Figure 5A:
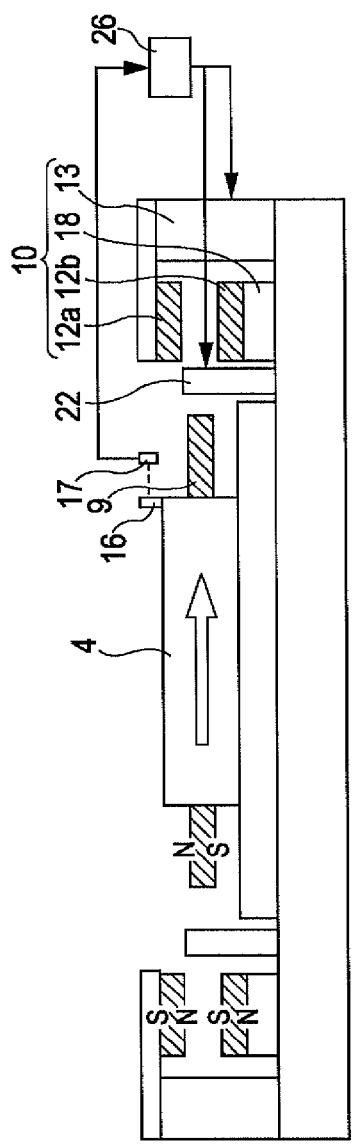
FIGS. 5A to 5C illustrate the manner in which a stage is moved in the third embodiment.
Figure 5B:
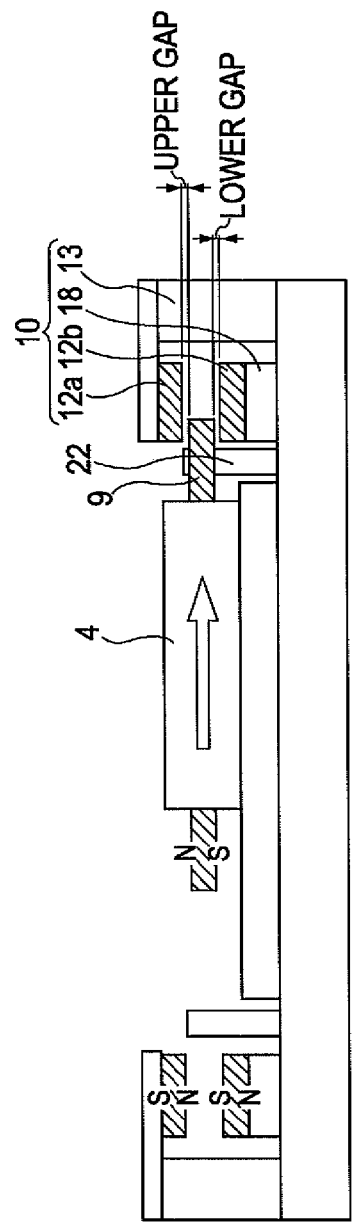
Figure 5C:
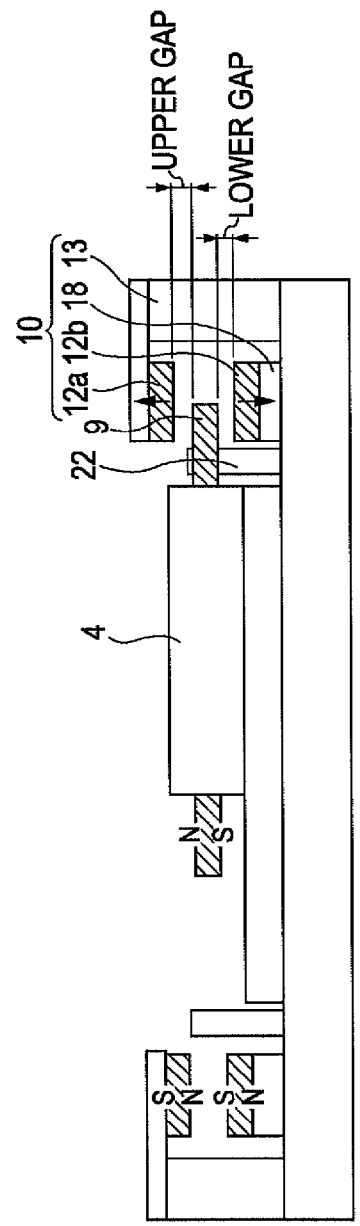

FIGS. 5A to 5C are schematic side views illustrating the manner in which the stage 4 is moved and retained by the holding mechanism 22.

When the stage 4 moves from the position shown in FIG. 5A to the position shown in FIG. 5B, the fixed magnetic unit 10 on the right drives the permanent magnets 12a and 12b so as to reduce the gaps between the permanent magnets 9 and 12a and between the permanent magnets 9 and 12b. Accordingly, the deceleration of the stage 4 is increased. FIG. 5C shows the state in which the velocity of the stage 4 is reduced to zero (0) after passing the position shown in FIG. 5B. In this state, the holding mechanism 22 is operated so as to retain the stage 4. The holding mechanism 22 is controlled in accordance with the position of the stage 4.

The holding mechanism 22 can be applied to, for example, a reticle stage in an exposure apparatus. This is because the reticle stage must generally be retained at a reticle-replacement position when a reticle (original) placed on the stage is replaced.

After the stage 4 is retained, the fixed magnetic unit 10 drives the permanent magnets 12a and 12b so as to increase the gaps between the permanent magnets 9 and 12a and between the permanent magnets 9 and 12b, thereby reducing the repulsive force. Accordingly, the retaining force applied by the holding mechanism 22 can be reduced. Thus, degradation of the flatness of the reticle that occurs if a large force is applied to the stage when the reticle is replaced can be prevented.

Fourth Embodiment

A forth embodiment of the present invention will be described below with reference to FIGS. 6A to 6E. In the fourth embodiment, descriptions regarding structures similar those of the first embodiment will be omitted.

Figure 6D:
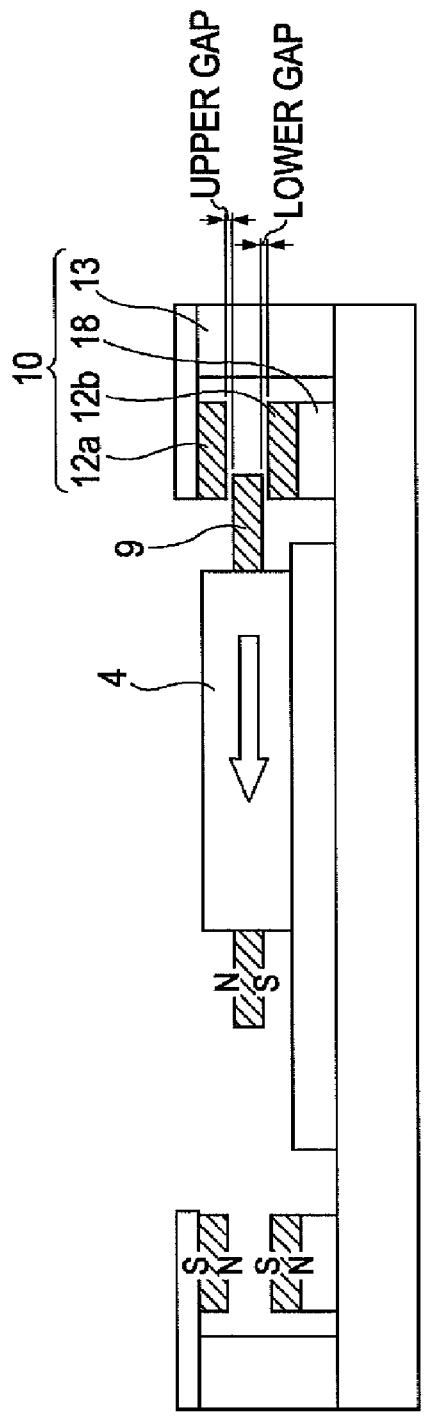
Figure 6E:
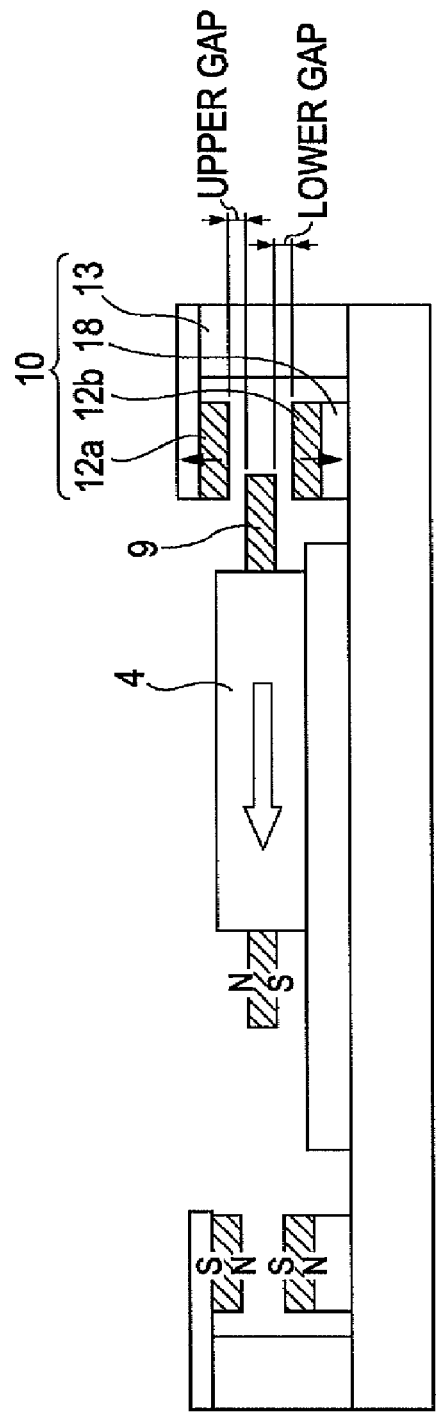

Referring to FIG. 6A, the stage 4 is accelerated by the fixed magnetic unit 10 on the left and is moved rightward. When the stage 4 enters a region where the repulsive force is applied, the fixed magnetic unit 10 sets the gaps between the permanent magnets 9 and 12a and between the permanent magnets 9 and 12b to be relatively large. Then, after the stage 4 enters the region where the repulsive force is applied, the fixed magnetic unit 10 drives the permanent magnets 12a and 12b so as to reduce the gaps, as shown in FIG. 6B. In this case, the decelerating force is gradually increased, so that the stage 4 is prevented from suddenly receiving the force and being deformed as a result. FIG. 6C shows the state in which the velocity of the stage 4 is reduced to zero (0). Then, the stage 4 receives the repulsive force and moves leftward as shown in FIG. 6D, and reaches the position shown in FIG. 6E. When the stage 4 leaves the region where the repulsive force is applied, the fixed magnetic unit 10 drives the permanent magnets 12a and 12b so as to increase the gaps between the permanent magnets 9 and 12a and between the permanent magnets 9 and 12b, as shown in FIG. 6E. This operation is also performed to prevent the stage 4 from receiving a sudden change in the force applied thereto.

Fifth Embodiment

Figure 7:
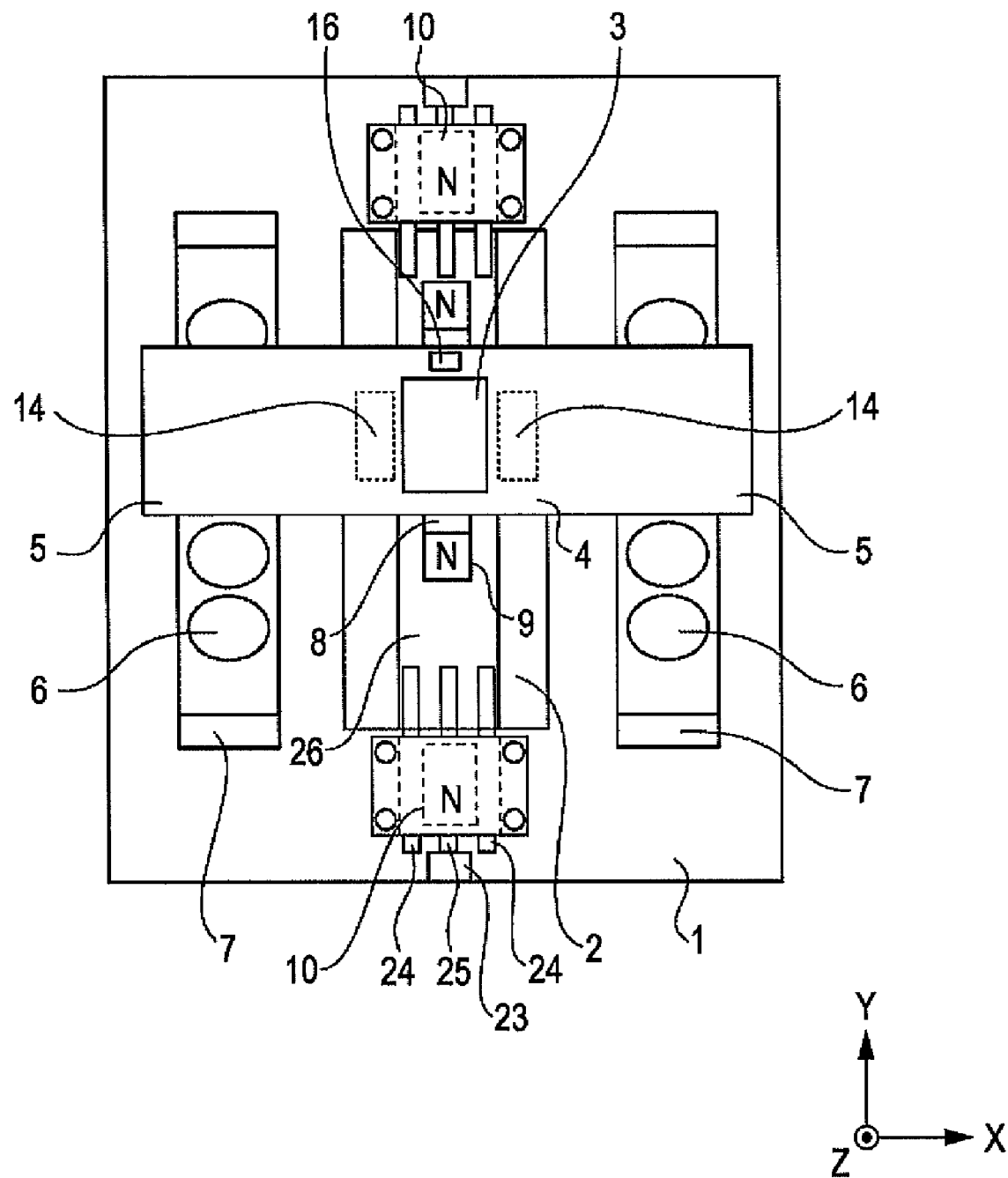
FIG. 7 is a schematic plan view of a stage apparatus according to a fifth embodiment.

FIG. 7 illustrates a stage apparatus according to a fifth embodiment of the present invention. In the fifth embodiment, descriptions regarding structures similar to those of the first embodiment will be omitted.

In the fifth embodiment, the position of each fixed magnetic unit 10 can be changed in the Y direction. The stage apparatus according to the present invention can be used as, for example, a reticle stage in an exposure apparatus. In a typical exposure apparatus, an exposure process can be performed using only a part of a reticle pattern instead of using the entire region thereof. In such a case, it is necessary to change the positions at which acceleration and deceleration of a stage are started. Accordingly, the structure of the present embodiment can be advantageously applied as a reticle stage in an exposure apparatus.

Referring to FIG. 7, each of the fixed magnetic units 10 can be moved in the Y direction using a motor 23 and a feed screw 25. A guide 2 includes two guide rails 24 for guiding each of the fixed magnetic units 10. When the motor 23 is rotated, the feed screw 25 that is disposed coaxial with the motor 23 is rotated accordingly, thereby changing the position of the corresponding fixed magnetic unit 10 with a nut interposed between the fixed magnetic unit 10 and the feed screw 25. The position of each fixed magnetic unit 10 in the Y direction can be detected by an encoder included in the corresponding motor 23.

The mechanism for changing the position of each fixed magnetic unit 10 is not limited to the above-described mechanism, and can be modified as necessary. Since the positions of the fixed magnetic units 10 can be changed, the positions at which the acceleration and deceleration of the stage 4 are started can be changed. Accordingly, an exposure process using only a part of a reticle can be performed immediately if necessary.

Exposure Apparatus Including Stage Apparatus

Figure 8:
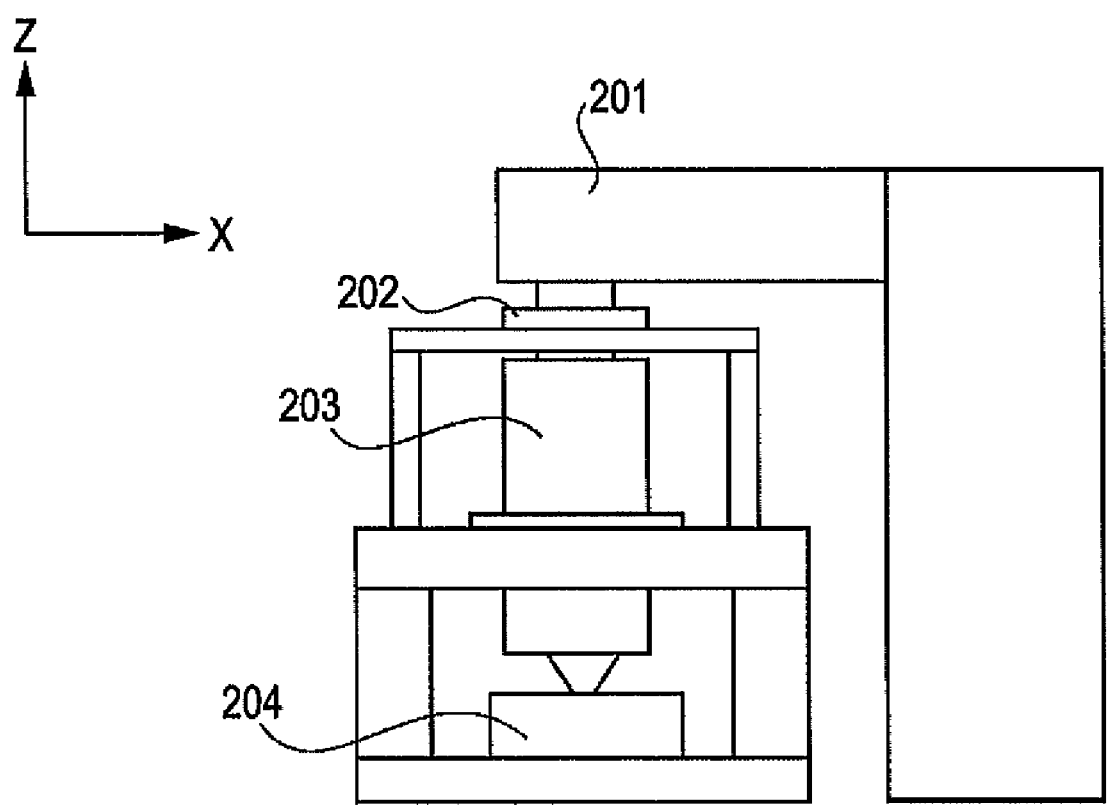
FIG. 8 illustrates an exposure apparatus including a stage apparatus.

An example of an exposure apparatus including a stage apparatus according to the present invention will be described below. Referring to FIG. 8, the exposure apparatus includes an illumination device 201, a reticle stage 202 on which a reticle is placed, a projection optical system 203, and a wafer stage 204 on which a wafer is placed. The exposure apparatus can project a circuit pattern of the reticle onto the wafer by exposure using a step-and-repeat method or a step-and-scan method.

The illumination device 201 illuminates the reticle having the circuit pattern, and includes a light source unit and an illumination optical system. The light source unit includes a laser, such as an ArF excimer laser with a wavelength of about 193 nm, a KrF excimer laser with a wavelength of about 248 nm, and an F2 excimer laser with a wavelength of about 153 nm, as a light source. The laser is not limited to excimer lasers, and YAG lasers and other types of lasers can also be used. The number of lasers is also not limited. When a laser is used as a light source, a beam-shaping optical system for shaping a parallel light beam from the light source into a desired beam form and an incoherent optical system for converting a coherent laser beam into an incoherent laser beam can be used. The light source that can be used in the light source unit is not limited to lasers, but can be lamps, such as one or more mercury lamps and xenon lamps.

The illumination optical system is an optical system for illuminating the mask, and includes a lens, a mirror, a light integrator, a diaphragm, etc.

The projection optical system 203 can be an optical system including only a plurality of lens elements, an optical system including a plurality of lens elements and at least one concave mirror, an optical system including a plurality of lens elements and at least one diffractive optical element, such as a kinoform, or an optical system including only a plurality of mirrors.

The reticle stage 202 and the wafer stage 204 can be moved by, for example, linear motors. When the step-and-scan method is used, the reticle stage 202 and the wafer stage 204 are moved in synchronization with each other. In addition, an additional actuator is provided on at least one of the wafer stage 204 and the reticle stage 202 to position the reticle pattern with respect to the wafer.

The above-described exposure apparatus can be used for manufacturing a semiconductor device, such as a semiconductor integrated circuit, a micromachine, and a device like a thin film magnetic head that has a micropattern.

Device Manufacturing Method Using Exposure Apparatus

Figure 9:
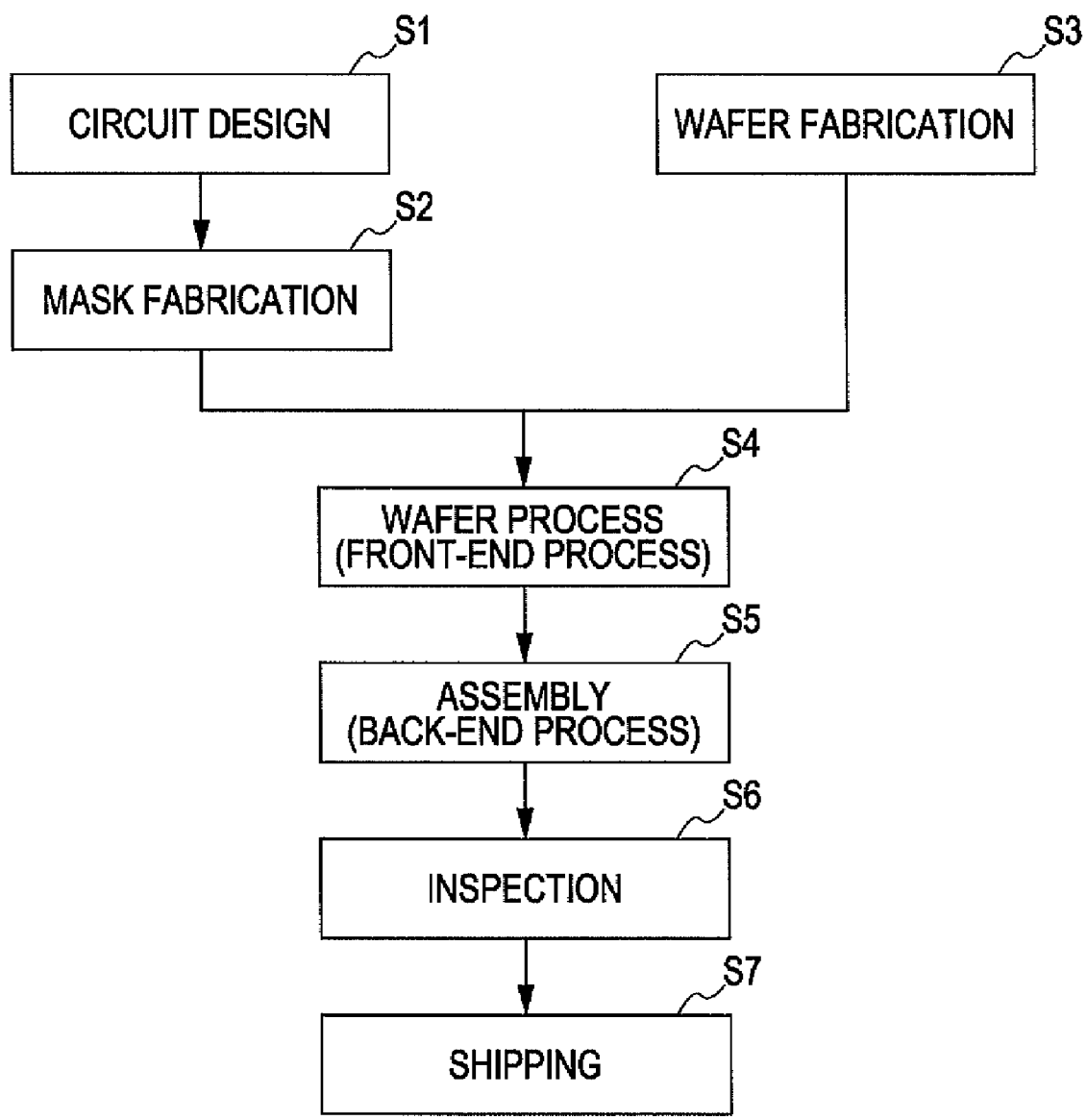
FIG. 9 illustrates a method for manufacturing a device using the exposure apparatus.

An example of a device manufacturing method using the above-described exposure apparatus will be described below with reference to FIGS. 9 and 10. FIG. 9 is a flowchart showing processes for manufacturing devices (for example, semiconductor chips such as IC's and LSI's, LCD's, and CCD's). In this example, a manufacturing method of semiconductor chips will be described.

In Step S1 (circuit design), a circuit of semiconductor chips is designed. In Step S2 (mask fabrication), a mask is fabricated in the designed circuit pattern. In Step S3 (wafer fabrication), a wafer is formed of a material such as silicon. In Step S4 (wafer process), called a front-end process, actual circuits are formed on the wafer by lithography with the mask and the wafer using the exposure apparatus. In Step S5 (assembly), called a back-end process, semiconductor chips are formed from the wafer obtained in Step S4. This process includes an assembly process (dicing and bonding) and a packaging process (chip sealing). In Step S6 (inspection), the semiconductor chips obtained in Step S5 are tested for, for example, operation and durability. The semiconductor chips are thus manufactured through the above processes, and are then shipped (Step S7).

Figure 10:
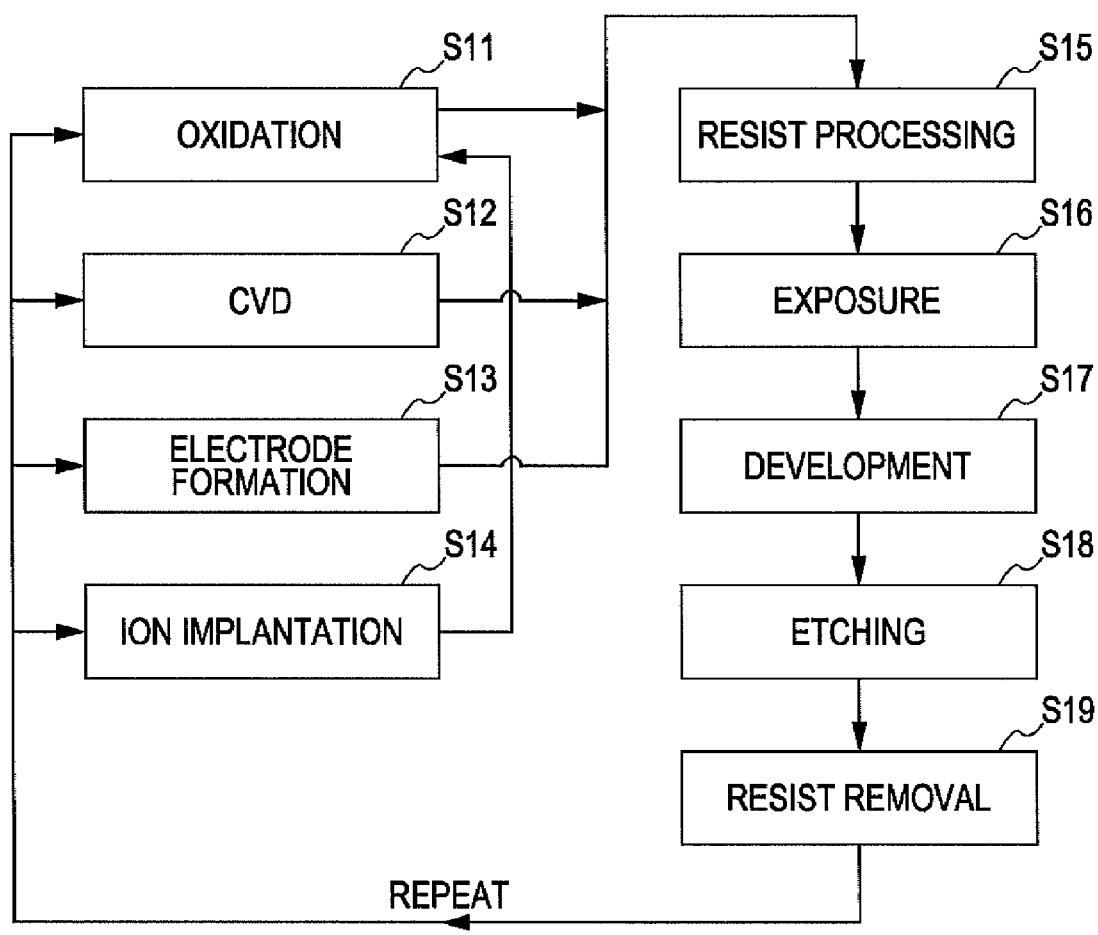
FIG. 10 illustrates a wafer process shown in FIG. 9.
Figure 11A:
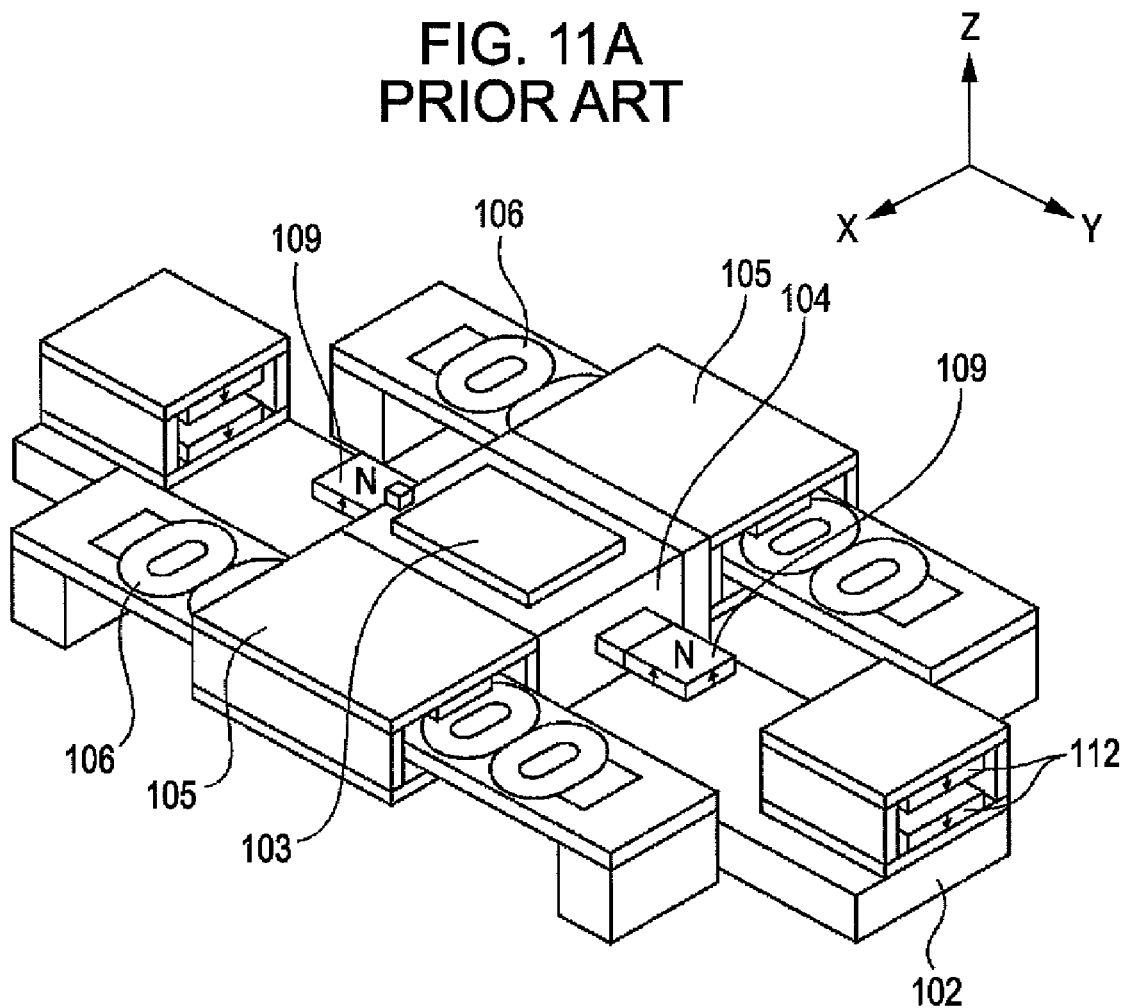
FIGS. 11A and 11B illustrate a known stage apparatus.
Figure 11B:
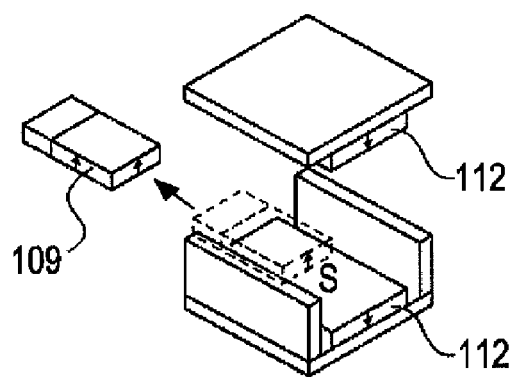

FIG. 10 is a detailed flowchart of the wafer process performed in Step S4 shown in FIG. 9. In Step S11 (oxidation), the surface of the wafer is oxidized. In Step S12 (CVD), an insulating film is formed on the surface of the wafer. In Step S13 (electrode formation), electrodes are formed. In Step S14 (ion implantation), ions are implanted into the wafer. In Step S15 (resist processing), a photosensitive agent is applied to the wafer. In Step S16 (exposure), the circuit pattern of the mask is projected onto the wafer by the exposure apparatus. In Step S17 (development), the exposed wafer is developed. In Step S18 (etching), parts other than the developed resist image are etched away. In Step S19 (resist removal), the resist, which becomes unnecessary after etching, is removed. By repeating these steps, a multi-layer circuit pattern is formed on the wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-079056 filed Mar. 22, 2006, which is hereby incorporated by reference herein in its entirety.

What is claimed is:

1. A stage apparatus comprising:
    a movable stage;
    a magnetic unit including:
        a first permanent magnet provided on the stage and magnetized in a direction perpendicular to a moving direction of the stage; and
        at least one pair of second permanent magnets magnetized such that opposing portions of the first and second permanent magnets have the same pole,
        wherein the magnetic unit applies a force to the stage in the moving direction thereof by placing the first permanent magnet between the pair of second permanent magnets; and
    an actuator configured to change a gap between the pair of second permanent magnets.

2. The stage apparatus according to claim 1, further comprising a fixing unit configured to fix the second permanent magnet driven by the actuator.

3. The stage apparatus according to claim 1, wherein the actuator is driven such that a line of action of the force applied to the stage by the magnetic unit passes through the center of gravity of a movable table including the stage.

4. The stage apparatus according to claim 1, further comprising a holding mechanism restricting a position of the stage in the moving direction thereof while the first permanent magnet is placed between the second permanent magnets.

5. The stage apparatus according to claim 1, further comprising a detector detecting a position of the stage in the moving direction thereof, wherein the actuator is driven in accordance with the position of the stage detected by the detector.

6. The stage apparatus according to claim 1, wherein the actuator is driven such that gaps between the first permanent magnet and the second permanent magnets are reduced when the stage enters a region in which the force generated by the magnetic unit is applied to the stage, thereby reducing a change rate of the force applied to the stage.

7. The stage apparatus according to claim 1, wherein the actuator is driven such that gaps between the first permanent magnet and the second permanent magnets are increased when the stage leaves a region in which the force generated by the magnetic unit is applied to the stage, thereby reducing the force applied to the stage.

8. The stage apparatus according to claim 1, further comprising a driver driving the second permanent magnets in the moving direction.

9. A scanning exposure apparatus, comprising:
the stage apparatus according to claim 1,
wherein the stage apparatus positions an original.

10. A method for manufacturing a device, comprising:
projecting a pattern of an original onto a substrate by exposure using the scanning exposure apparatus according to claim 9; and
developing the substrate.

11. A stage apparatus for scanning an original in a scanning exposure apparatus, the stage apparatus comprising:
a stage configured to support the original thereon and movable in a scanning direction while the original is supported thereon;
magnetic units provided at both sides of the stage in the scanning direction, each magnetic unit including:
a first permanent magnet magnetized in a direction perpendicular to the scanning direction; and
at least one pair of second permanent magnets magnetized such that opposing portions of the first and second permanent magnets have the same pole,
wherein each magnetic unit applies a force to the stage in the scanning direction by placing the first permanent magnet between the pair of second permanent magnets; and
an actuator configured change a gap between the pair of second permanent magnets.

12. The stage apparatus according to claim 11, wherein the at least one pair of second permanent magnets is provided at each of stroke ends of the stage in the scanning direction.

* * * * *